Jan. 24, 1967 R. L. DELANOY ETAL 3,300,654

SCHMITT TRIGGER WITH ACTIVE COLLECTOR TO BASE COUPLING

Filed March 7, 1963

INVENTORS
RICHARD L. DELANOY
GEORGE J. LAURER

BY John C. Black
ATTORNEY

United States Patent Office 3,300,654

Patented Jan. 24, 1967

3,300,654

SCHMITT TRIGGER WITH ACTIVE COLLECTOR TO BASE COUPLING

Richard L. Delanoy, Endicott, and George J. Laurer, Endwell, N.Y., assignors to International Business Machines Corporation, New York, N.Y., a corporation of New York Filed Mar. 7, 1963, Ser. No. 263,610
5 Claims. (Cl. 307—88.5)

This invention relates to an improved transistorized Schmitt trigger capable of operating at high speeds.

In the conventional transistorized Schmitt triggers, which employ the passive coupling between the collector of a first transistor and the base of a second transistor, "a compromise must be reached between stability and speed of response to achieve desired characteristics," "A Transistorized Schmitt Trigger," by J. Corsiglia, Electrical Design News, June 1961. Operation of the transistors in saturation is required for stability and this in turn increases the turn-off delays substantially. So far as is known, there has not been a satisfactory solution to this inherent drawback in the design of transistorized Schmitt triggers. In known applications, expensive transistors with shorter turn-off delays are resorted to for an acceptable speed of operation.

Accordingly, it is a primary object of the present invention to provide a stable Schmitt trigger which operates at substantially higher speeds than known Schmitt triggers where the same transistor type is used in each trigger.

It is another object of the present invention to provide a Schmitt trigger in which the transistors are operated below the saturation level yet assure the desired square-wave output characteristics.

The objects of the present invention are achieved in one preferred embodiment of the invention by providing an active collector-to-base coupling between the trigger transistors. More specifically, the collector-to-base coupling preferably comprises a pair of transistors having a common emitter impedance with the base of the first coupling transistor connected to the collector of the trigger input transistor and the base of the second coupling transistor connected to a desired reference potential and its collector connected to the base of the trigger output transistor.

The active coupling of the improved trigger powers the collector-to-base signal of the trigger transistors by virtue of the buffering and isolation provided by the coupling network. This permits the collector of the first transistor to drive additional loads (out-of-phase) which was not possible in earlier Schmitt triggers because the base signal of the conventional trigger was dependent upon the collector voltage level for proper operation of the circuit.

The active coupling network also provides a second in-phase output at the collector of the first coupling transistor. These additional in-phase and out-of-phase outputs are provided without additional transistor delays, whereas the conventional trigger required an additional inverter stage with its inherent delay for an out-of-phase signal.

Accordingly, it is another object of the present invention to provide in an improved Schmitt trigger means producing additional in-phase and/or out-of-phase outputs without additional time delays.

The foregoing and other objects, features and advantages of the invention will be apparent from the following more particular description of a preferred embodiment of the invention, as illustrated in the accompanying drawings.

Figure 1:
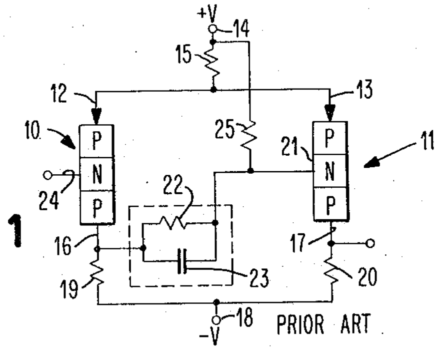
FIG. 1 is a schematic diagram of a conventional Schmitt trigger.

Thus the conventional Schmitt trigger of FIG. 1 comprises an input transistor 10 and an output transistor 11. The emitter terminals 12 and 13 of the transistors are coupled to a suitable supply terminal 14 by way of a common resistor 15, and the collector terminals 16 and 17 are coupled to a supply terminal 18 by way of individual resistors 19 and 20. The collector terminal 16 of the input transistor is coupled to the base terminal 21 of the output transistor by way of a passive coupling network comprising a parallel connected resistor 22 and capacitor 23. The output signal is taken from the collector terminal 17, and the input signal is applied to the base terminal 24 of the input transistor 10. Resistor 25 provides bias for the transistor 11.

As described more fully in the Corsiglia publication, the trigger is a regenerative circuit capable of assuming two stable states depending upon the momentary value of the input signal for producing a square-wave output. If the input signal is less negative than a predetermined D.C. level called the "lower trip point" LTP, the input transistor 10 will be Off; and the output transistor 11 will be On. When the input signal is more negative than a second predetermined input level called the "upper trip point" UTP, the input transistor will be On; the output transistor, Off. Regenerative action between the two transistors snaps the circuit into one stable state or the other.

The input signal must be D.C. coupled to the base of the input transistor to obtain faithful squaring action of the input waveform. A difference between the upper and lower trip points, i.e., the hysteresis of the trigger, must exist in order to insure a fast transition from one state to another; and, in the conventional trigger, operation in saturation is required.

Figure 2:
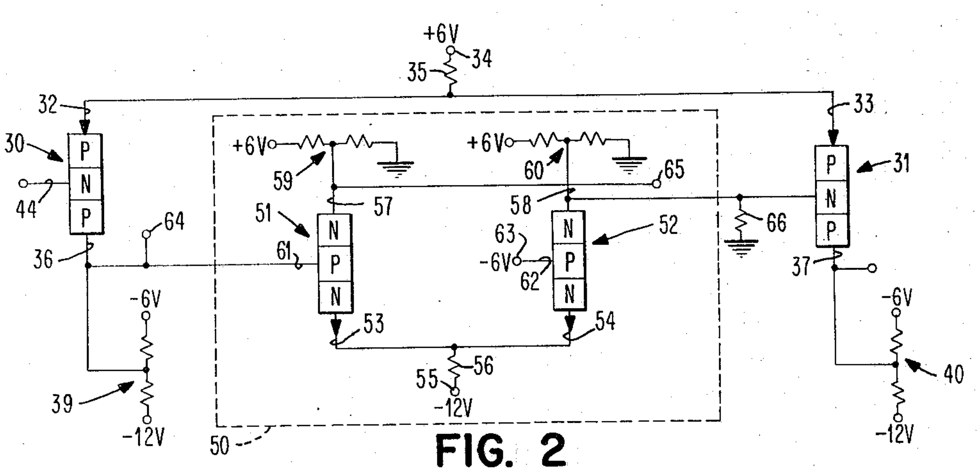
FIG. 2 is a schematic diagram of one preferred form of a Schmitt trigger incorporating the features of the present invention.

The improved trigger of FIG. 2 comprises an input transistor 30 and an output transistor 31. The emitter terminals 32 and 33 of the input and output transistors are coupled to a suitable supply terminal 34 by way of a common resistor 35. The collector terminals 36 and 37 of the input and output transistors are coupled to suitable supply terminals by way of individual resistance networks 39 and 40. The usual output signal is taken from the collector terminal 37 and the input signal is applied to the base terminal 44.

The collector-to-base coupling of the improved trigger is provided by an active coupling network 50 which comprises a pair of transistors 51 and 52. The coupling transistors 51 and 52 include emitter terminals 53 and 54, which are connected to a suitable supply terminal 55 by way of a common resistance 56, and collector terminals 57 and 58, which are connected to suitable supply terminals by way of resistance networks 59 and 60. The base terminal 61 of the transistor 51 is connected directly to the collector terminal 36 of the input transistor, and the base terminal 62 of the transistor 52 is connected to a suitable supply terminal 63. An out-of-phase output is provided at the terminal 64; and an additional in-phase output is provided at the terminal 65.

Assume that the improved trigger is in its normal or quiescent state with the input signal at zero volts. Transistors 30 and 51 will be turned Off and transistors 31 and 52 will be turned On. As the input signal applied to the base terminal 44 goes negative, it will reach a predetermined upper trip point UTP (FIG. 3) which will cause the transistor 30 to turn On. This upper trip point is approximately equal to the sum of the quiescent voltage level at the base of transistor 31 and the base-emitter junction voltage drops of transistors 30 and 31. As the transistor 30 turns On, it applies a positive-going pulse to the base of transistor 51 to turn the latter On and to turn transistor 52 Off. The transistor 31 is turned Off to produce a negative-going square-wave output pulse.

As the input pulse becomes less negative, it reaches the lower trip point LTP (FIG. 3) which is less negative than the upper trip point; and the transistors 30 and 51 are turned Off and transistors 31 and 52 are again turned On.

In one known application, an additional resistor 66 is connected between the collector terminal 58 and ground to increase the circuit sensitivity and to decrease the hysteresis. This freedom to vary circuit sensitivity and hysteresis at will can be provided only where (as in the improved circuit) the base of the output transistor 31 is isolated from the collector of the input transistor 30 to permit an optimum low impedance input into the transistor 31. Conversely, with an increase in the circuit hysteresis (by an increase in the resistance of resistor 66), the improved Schmitt trigger provides unusually good noise rejection in additoin to providing sharply squared waves at high frequencies, for example in the low megacycle range.

Inasmuch as the transistors 30, 31, 51, 52 are never operated in saturation, inexpensive transistors may be utilized without encountering excessive time delays.

The values of the voltage levels set forth in FIGS. 2 and 3 and the component values set forth in the table below are illustrated merely by way of example, and the invention is not to be limited thereby. It will be appreciated that the polarities of the supply potentials and the transistor types may be changed to respond to the positive portions of the input signals without departing from the spirit of the invention. Also, the upper and lower trip points may be shifted above, below and on either side of the zero reference potential shown in FIG. 3 by the suitable selection of proper source potentials and NPN and PNP transistor types.

Figure 3:
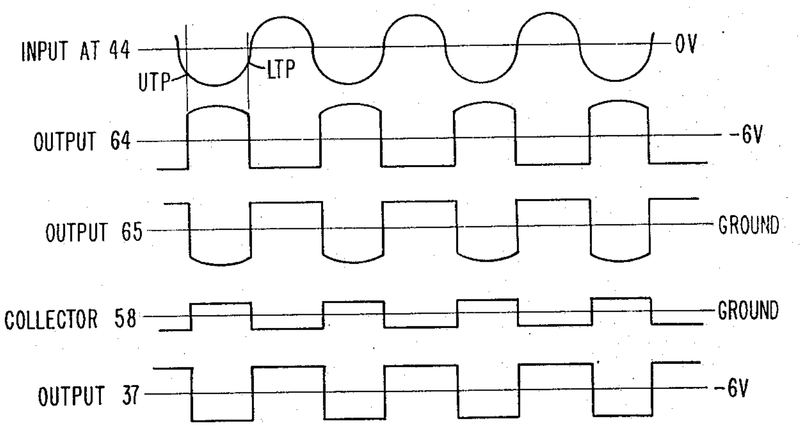
FIG. 3 shows waveforms produced at various junctions in the trigger of FIG. 2.

Typical component values for producing the waveforms in FIG. 3 are:

| | Ohms |
|---|---|
| Resistor **35** | 1,000 |
| Resistor **56** | 1,000 |
| Resistor **66** | 360 |
| Resistor networks **50** and **60**: | |
| +6 v. connection | 2,400 |
| Ground connection | 360 |
| Resistor networks **39** and **40**: | |
| −6 v. connection | 360 |
| −12 v. connection | 2,400 |

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A signal translating device comprising
input and output transistors each having base, emitter and collector terminals,
means including a common emitter impedance and individual collector impedances connecting the transistors to operating potential terminals for normally maintaining the input and output transistors in a quiescent state of the device,
third and fourth transistors, each having base emitter and collector terminals,
means including a common emitter impedance and individual collector impedances connecting the latter transistors to operating potential terminals and including connections between the collector terminal of the input transistor and the base terminal of the third transistor and between the base and collector terminals of the fourth transistor and a reference potential and the base terminal of the output transistor respectively normally maintaining the third and fourth transistors in the quiescent state of the device,
the base terminal of the input transistor being adapted to receive input signals of a magnitude and potential for switching the transistors from the quiescent state to an operating state of the device.

2. A signal translating device comprising
input and output transistors each having base, emitter and collector terminals,
means including a common emitter impedance and individual collector impedances connecting the transistors to operating potential terminals for normally maintaining the input and output transistors Off and On respectively,
third and fourth transistors, each having base, emitter and collector terminals,
means including a common emitter impedance and individual collector impedances connecting the latter transistors to operating potential terminals and including connections between the base terminals of the third and fourth transistors and the collector terminal of the input transistor and a predetermined reference potential terminal respectively and a connection between the collector terminal of the fourth transistor and the base terminal of the output transistor normally maintaining the third and fourth transistors Off and On respectively,
the base terminal of the input transistor being adapted to receive input signals of a magnitude and potential for switching the input and third transistors On and the output and fourth transistors Off.

3. A signal translating device comprising
input and output transistors each having base, emitter and collector terminals, the base terminal being adapted to receive input signals at different potential levels,
means including a common emitter impedance and individual collector impedances connecting the transistors to operating potential terminals for operating the input transistor in conduction below saturation at one predetermined input signal level and for operating the output transistor in conduction below saturation at a different predetermined input signal level,
third and fourth transistors, each having base, emitter and collector terminals,
the base terminals of the third and fourth transistors being coupled respectively to the collector terminal of the input transistor and to a predetermined reference potential terminal and the collector terminal of the fourth transistor being coupled to the base of the output transistor,
means including a common emitter impedance and individual collector impedances connecting the latter transistors to operating potential terminals for normally maintaining the third and fourth transistors in conduction below saturation incident to the application of the one and different signal levels to the input transistor respectively.

4. A Schmitt trigger comprising
input and output transistors each having base, emitter and collector terminals, and
means coupling the transistors to each other and to operating potential terminals for rapid switching of the input and output transistors between their quiescent and operated states in response to signals applied to the input transistor,
the means coupling the transistors to each other including
third and fourth transistors each having base, emitter and collector terminals,
the base terminal of the third transistor and the collector terminal of the fourth transistor being connected respectively to the collector terminal of the input transistor and the base terminal of the output transistor,
common emitter impedance means and individual collector impedance means coupling the third and fourth transistors to operating potential terminals, and a desired reference potential terminal connected to the base terminal of the fourth transistor establishing the quiescent state of the third and fourth transistors, said third and fourth transistors responsive to switching of the input transistor for increasing the speed at which the output transistor changes state.

5. A Schmitt trigger comprising input and output transistors each having base, emitter and collector terminals, and means coupling the transistors to each other and to operating potential terminals for rapid switching of the input and output transistors from their normal Off and On states to their On and Off states and back to their normal states in response to signals applied to the base terminal of the input transistor greater than a predetermined value and less than a lower predetermined value, the means coupling the transistors to each other including third and fourth transistors each having base, emitter and collector terminals, the base terminal of the third transistor and the collector terminal of the fourth transistor being connected respectively to the collector terminal of the input transistor and the base terminal of the output transistor, common emitter impedance means and individual collector impedance means coupling the third and fourth transistors to operating potential terminals, and a predetermined reference potential terminal connected to the base terminal of the fourth transistor for normally maintaining the third and fourth transistors Off and On respectively, said third and fourth transistors responsive to turning of the input transistor On and Off for increasing the speed at which the output transistor turns Off and On respectively.

References Cited by the Examiner

UNITED STATES PATENTS

| | | | |
|---|---|---|---|
| 2,987,632 | 6/1961 | Milford | 307—88.5 |
| 3,084,266 | 4/1963 | Williams | 307—88.5 |
| 3,188,489 | 6/1965 | Dorsey | 307—88.5 |
| 3,191,069 | 6/1965 | Sampson | 307—88.5 |
| 3,214,602 | 10/1965 | Heyning et al. | 307—88.5 |

OTHER REFERENCES

Electronic Industries, 1961, "Basic RTCL Circuits," by William D. Roehr, pp. 101, 102 and 103.

ARTHUR GAUSS, *Primary Examiner.*

J. JORDAN, *Assistant Examiner.*